United States Patent
Ishikawa

(10) Patent No.: US 7,772,542 B2
(45) Date of Patent: Aug. 10, 2010

(54) IMAGING APPARATUS HAVING PHOTOELECTRIC CONVERSION UNIT WITH POSITION ADJUSTMENT PLATE

(75) Inventor: Koji Ishikawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/331,128

(22) Filed: Dec. 9, 2008

(65) Prior Publication Data

US 2009/0146051 A1    Jun. 11, 2009

(30) Foreign Application Priority Data

Dec. 10, 2007    (JP) .............................. 2007-318228

(51) Int. Cl.
*H01J 40/14*    (2006.01)
*H04N 5/225*    (2006.01)
(52) U.S. Cl. ........................ 250/239; 348/374
(58) Field of Classification Search ............ 250/239; 348/340, 373, 374; 257/433
See application file for complete search history.

(56) References Cited

U.S. PATENT DOCUMENTS 6,654,064 B2    11/2003    Ishikawa
2007/0096234 A1*    5/2007    Tanaka et al. ............... 257/433

FOREIGN PATENT DOCUMENTS

JP           11-261904 A        9/1999

* cited by examiner

*Primary Examiner*—Thanh X Luu
(74) *Attorney, Agent, or Firm*—Canon U.S.A., Inc. I.P. Division

(57) ABSTRACT

A photoelectric conversion element unit for use in an imaging apparatus including a photoelectric conversion element package containing a photoelectric conversion element, a wiring substrate where the photoelectric conversion element package is mounted on the first surface and an electronic component related to the photoelectric conversion element is mounted on a rear side of the first surface, and a support board attached to an attachment point in the imaging apparatus where the photoelectric conversion element package is fixed, wherein an opening smaller than an external form of the photoelectric conversion element package is formed in the support board, and the electronic component mounted on the wiring substrate is provided within the opening.

8 Claims, 7 Drawing Sheets

IMAGING APPARATUS HAVING PHOTOELECTRIC CONVERSION UNIT WITH POSITION ADJUSTMENT PLATE

BACKGROUND OF THE INVENTION

1. Field of the Invention

The present invention relates to a photoelectric conversion element unit used in an imaging apparatus, such as a digital camera and a video camera, and the imaging apparatus.

2. Description of the Related Art

When a photoelectric conversion element package is used in an imaging apparatus, it is necessary to align a light receiving surface of the photoelectric conversion element with an image forming surface of an imaging optical system with high accuracy. Therefore, a photoelectric conversion element package is fixed to a support plate whose external form is larger than the package, as is discussed in Japanese Patent Application Laid-Open No. 11-261904. Thus, an alignment of the support plate is performed so as to match a reception surface of a photoelectric conversion element with an image forming surface of an imaging optical system when the support plate is attached to a predetermined attachment point.

Japanese Patent Application Laid-Open No. 11-261904 discusses a method for reducing the total thickness of a photoelectric conversion element package, a support board and a printed wiring board where a photoelectric conversion element package is mounted since downsizing, and particularly a low-profile imaging apparatus. More specifically, a printed wiring board is arranged between a leadless type photoelectric conversion element package and a support board.

An imaging apparatus requires the aforementioned photoelectric conversion element package as well as a driving circuit that drives the photoelectric conversion element package, and a signal processing circuit that processes an output signal from the photoelectric conversion element. It is desirable that the driving circuit and the signal processing circuit are arranged as close as possible to the photoelectric conversion element to shorten the wiring length between them. This is because noise may likely be added to a minute analog signal output from the photoelectric conversion element when the wiring length becomes longer. Further, along with increased pixels and increased functions of the photoelectric conversion element, the speed of a driving clock of the photoelectric conversion element is enhanced. Under such a situation, a waveform of a signal driving the photoelectric conversion element may get out of shape due to the wiring length and an influence of a connector used for connecting the circuits, and the photoelectric conversion element cannot be properly driven. Furthermore, unnecessary radiation from the high speed clock lines may increase.

A driving circuit and a signal processing circuit are conventionally connected to the top of a flexible printed wiring board extracted from a photoelectric conversion element. In other words, a wiring length from the photoelectric conversion element to the driving circuit and the signal processing circuit has been long.

SUMMARY OF THE INVENTION

According to an aspect of the present invention, a photoelectric conversion element unit for use in an imaging apparatus includes a photoelectric conversion element package containing a photoelectric conversion element, a wiring substrate where the photoelectric conversion element package is mounted on the first surface and an electronic component related to the photoelectric conversion element is mounted on the rear side of the first surface, and a support board attached to an attachment point in the imaging apparatus where the photoelectric conversion element package is fixed. An opening smaller than an external form of the photoelectric conversion element package is formed in the support board, and the electronic component mounted on the wiring substrate is provided within the opening. According to another aspect of the present invention, the imaging apparatus includes both an imaging optical system and the photoelectric conversion element unit, and the photoelectric conversion element of the photoelectric conversion element unit is aligned with an image forming surface of the imaging optical system.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the various drawings.

Figure 1:
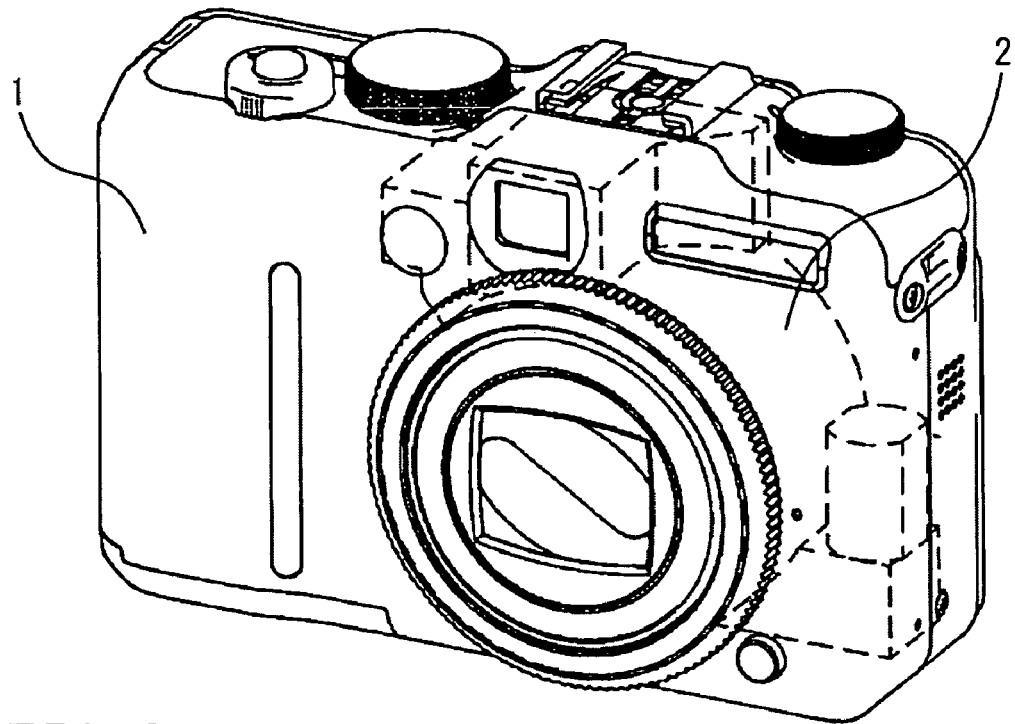
FIG. 1 is an external view of the imaging apparatus (digital camera) according to an exemplary embodiment of the present invention.
Figure 2:
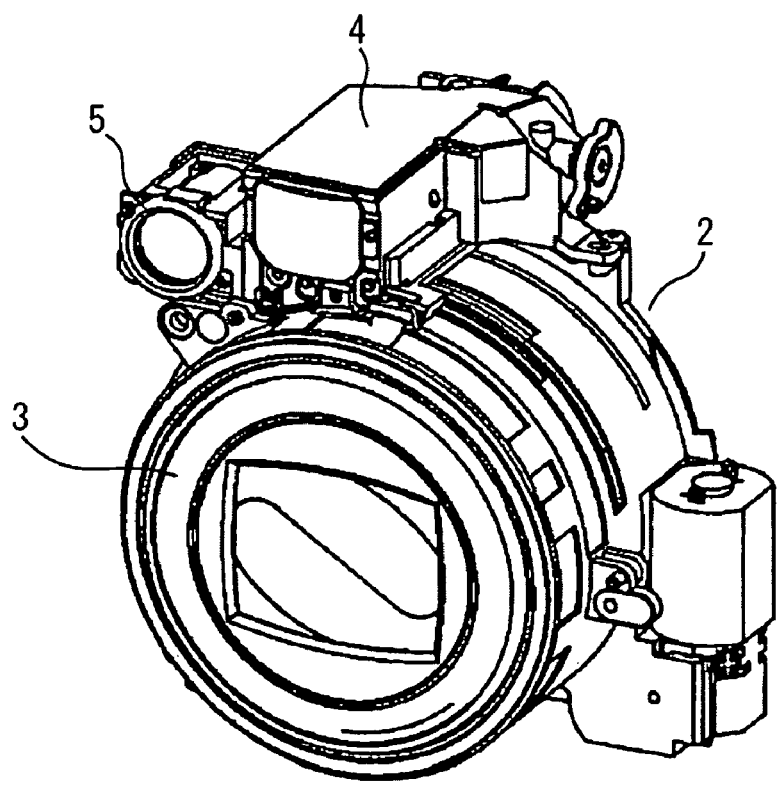
FIG. 2 is a perspective view of the image unit mounted in the imaging apparatus according to the exemplary embodiment of the present invention.
Figure 3:
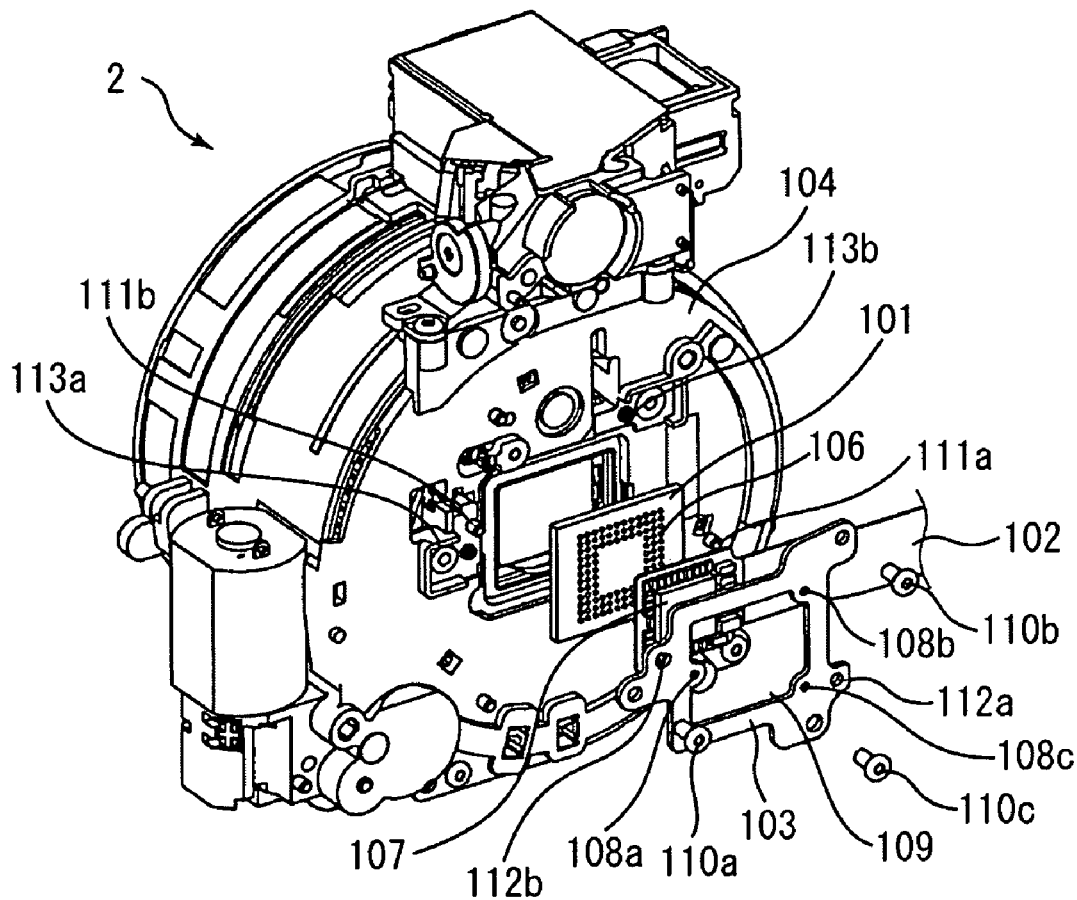
FIG. 3 is a perspective view illustrating a disassembled photoelectric conversion element unit attached to the image unit according to the exemplary embodiment of the present invention.
Figure 4:
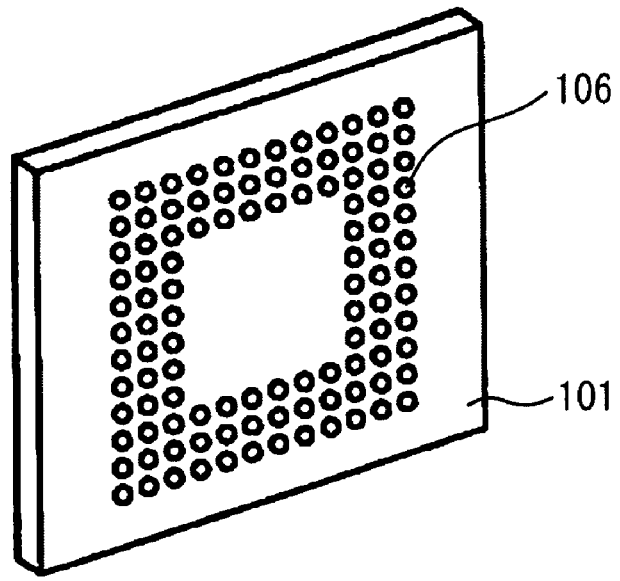
FIG. 4 is a perspective view illustrating a rear surface of the photoelectric conversion element package according to the exemplary embodiment of the present invention.

FIG. 1 illustrates an appearance of an imaging apparatus (digital camera) using a photoelectric conversion element unit according to the exemplary embodiment of the present invention. FIGS. 2 and 3 are perspective views of an image unit to which the photoelectric conversion element unit is attached.

According to FIG. 1, an image unit 2 is arranged within a digital camera 1. The photoelectric conversion element unit of the present invention is attached to image unit 2 as discussed below.

As FIG. 2 illustrates, the image unit 2 includes a photographic lens barrel 3, a finder unit 4, and an autofocus (AF) auxiliary light unit 5. The front surface is exposed to the outside from an opening at the front exterior of the digital camera 1, as FIG. 1 illustrates.

According to FIG. 3, the image unit 2 includes a photoelectric conversion package 101, a printed wiring board 102 as a wiring substrate, and a position adjustment plate 103 as a support board. The photoelectric conversion element unit is attached to a back surface (surface at the image side) 104 of the image unit 2 (the photographic lens barrel 3) in the digital camera 1. FIG. 3 illustrates the photoelectric conversion element unit in a disassembled state which allows various features to be more easily seen.

Figure 9A:
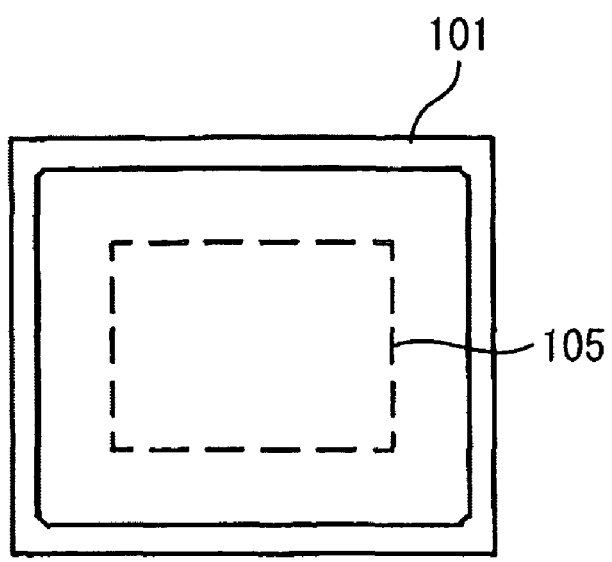
FIGS. 9A to 9C are respectively a top view, a side view and a back side view of the photoelectric conversion element package according to the exemplary embodiment of the present invention.
Figure 9B:
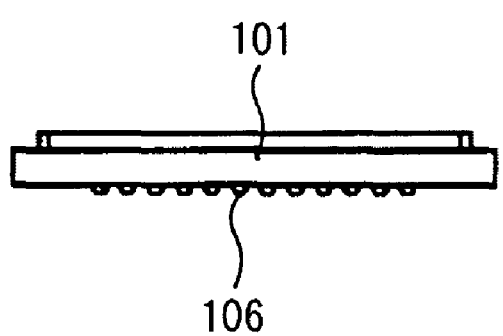
Figure 9C:
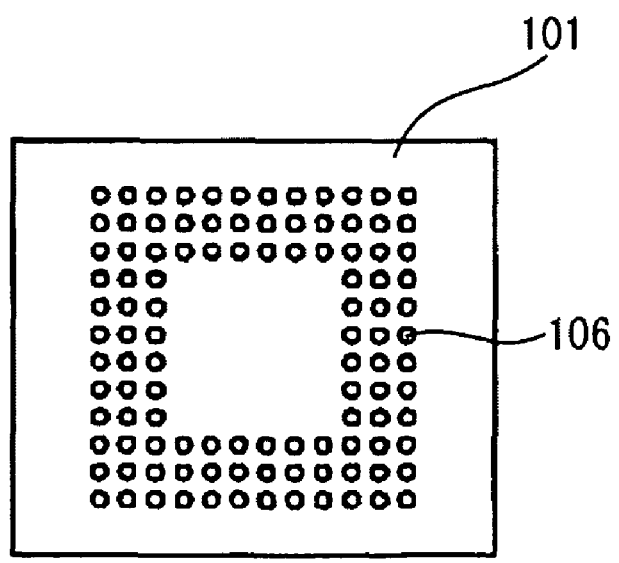

The photoelectric conversion element package 101 is a package containing a photoelectric conversion element such as a charge-coupled device (CCD) sensor, and a complementary metal-oxide semiconductor (CMOS) sensor. As FIGS. 4 and 9A to 9C illustrate, electrodes 106 are mounted on the rear surface of the photoelectric conversion element package 101. The electrodes 106 are formed from solder balls arrayed in a grid shape. As FIG. 9A illustrates, the photoelectric conversion element package 101 has a photoelectric conversion element 105. According to the present exemplary embodiment, a photoelectric conversion element package 101 of a ball grid array (BGA) type is used as an example.

Figure 5:
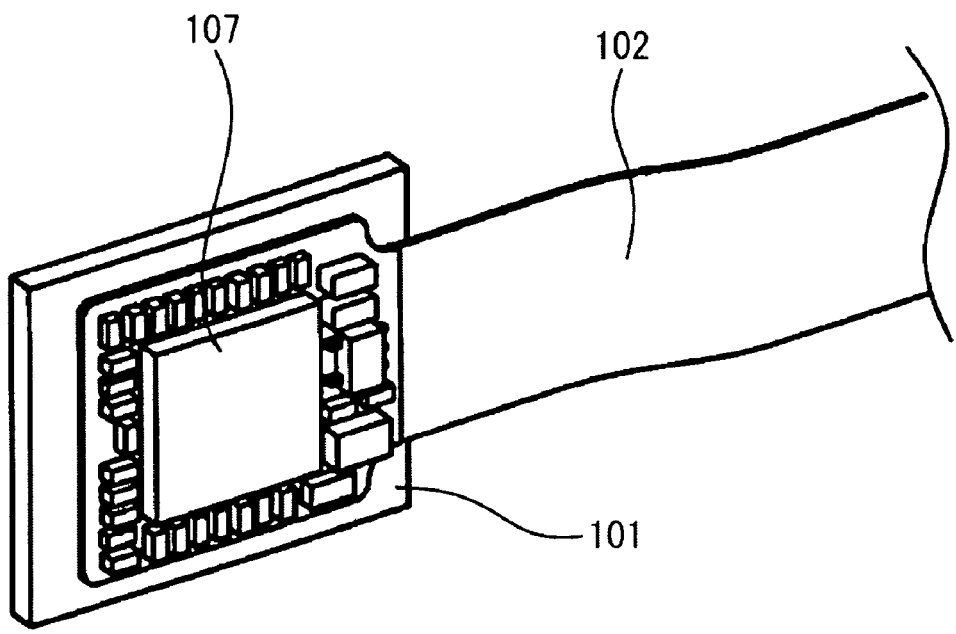
FIG. 5 is a perspective view illustrating the photoelectric conversion element package and the electronic component attached to the printed wiring board according to the exemplary embodiment of the present invention.

As illustrated in FIG. 5, an electronic component 107 related to the photoelectric conversion element 105 is mounted in the regions where the rear side of the printed wiring board 102 overlaps with the mounting regions of the photoelectric conversion element package 101 at the front surface side. The electronic component 107 related to the photoelectric conversion element 105 includes an IC and its peripheral circuit parts that drive the photoelectric conversion element 105 and process output signals from the photoelectric conversion element 105.

A land (not illustrated) is formed at a position corresponding to the electrode 106 of the photoelectric conversion element package 101 on the front surface which is the first surface of the printed wiring board 102. The land and the electrode 106 are aligned and reflowing of the electrode (solder ball) 106 is carried out. As a result, the electrode 106 is bonded to the land, and the photoelectric conversion element package 101 is mounted on the front surface (the first surface) of the printed wiring board 102.

Since the BGA type photoelectric conversion element package 101 and the electronic component are respectively mounted on the front and rear surfaces of the printed wiring board 102, there is a high wiring density. Further, high flexibility (bending property) is used at the wiring extraction part of the printed wiring board 102 that connects the printed wiring board 102 to other circuit substrates (not illustrated) so that the photoelectric conversion element 105 can be easily aligned with the image forming surface of an image forming lens optical system of the photographic lens barrel 3.

Therefore, a multi-layer rigid flexible printed wiring board is used for the printed wiring board 102 in the exemplary embodiment. A portion of the printed wiring board 102 where the photoelectric conversion element package 101 and the electronic component 107 are mounted has high wiring density. Such a portion of the printed wiring board 102 is structured as a rigid section. On the other hand, a wiring extraction portion that is bendable is structured as a flexible section.

The largest external part of the mounting region of the photoelectric conversion element package 101 in the printed wiring board 102 is formed to be smaller than the exterior of the photoelectric conversion element package 101. Therefore, when the photoelectric conversion element package 101 is mounted on the printed wiring board 102, the rear surface of the photoelectric conversion element package 101 is partly (hereinafter referred to as the rear surface exposing part) exposed to the outside of the printed wiring board 102.

Figure 6:
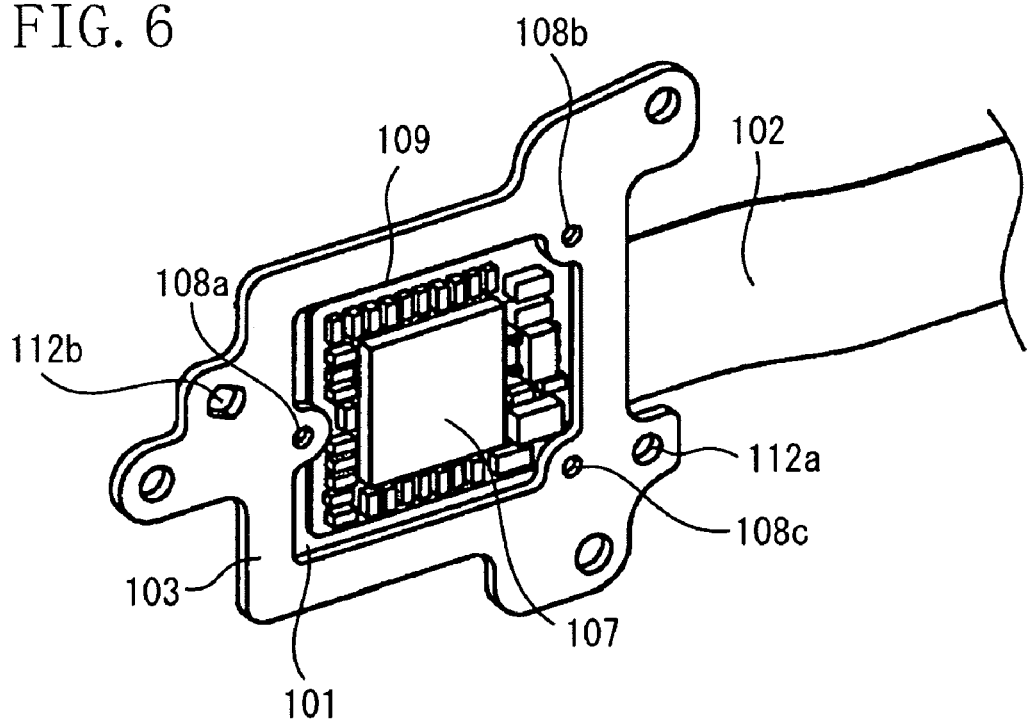
FIG. 6 is a perspective view illustrating the photoelectric conversion element unit according to the exemplary embodiment of the present invention.
Figure 10:
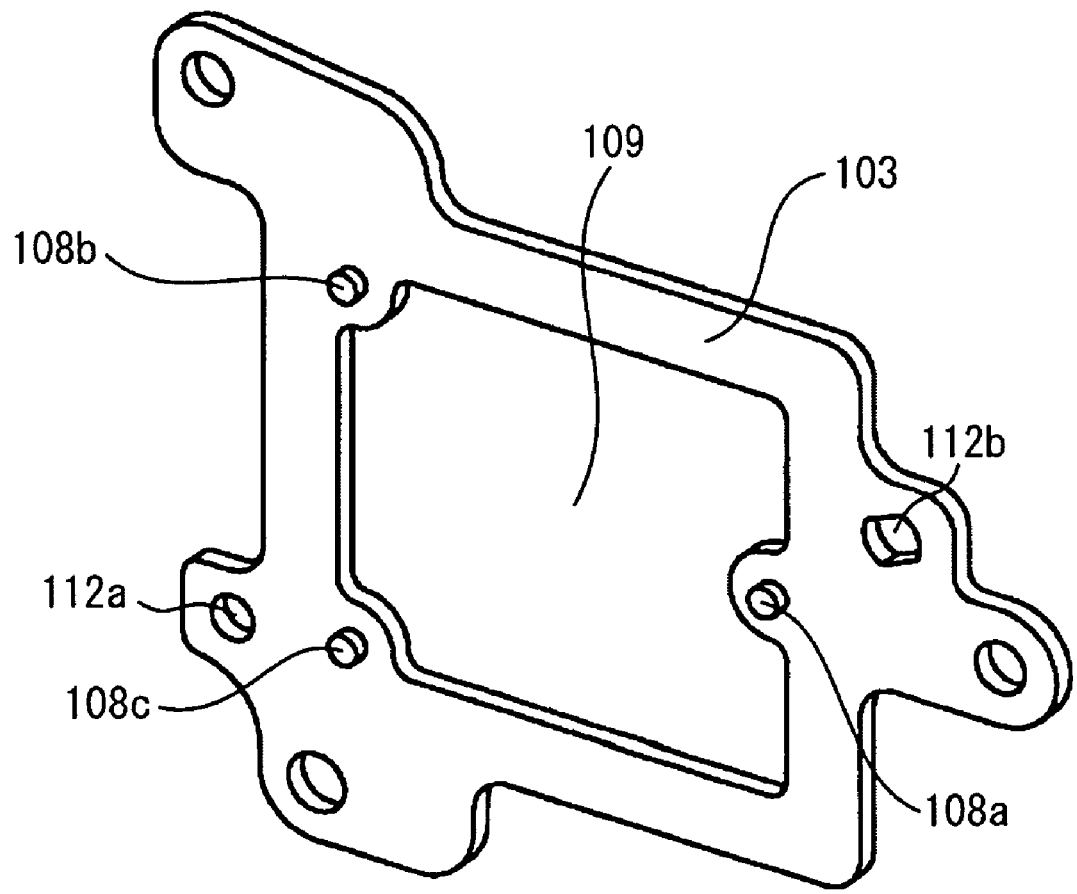
FIG. 10 is a perspective view of a position adjustment plate according to the exemplary embodiment of the present invention.

The photoelectric conversion element package 101 mounted on the printed wiring board 102 is fixed, as FIG. 6 illustrates, to a metal position adjustment plate 103 illustrated in FIG. 10.

The position adjustment plate 103 is formed in a rectangular frame-like shape, and a rectangular opening 109 is formed in the center. Protrusions 108a, 108b, and 108c are formed by a half-blanking processing around the opening 109. The protrusions determine a position in a direction perpendicular to the photo reception surface of the photoelectric conversion element package 101 (the optical axis direction of the photographic lens barrel 3) against the position adjustment plate 103. In the following description, the direction perpendicular to the light receiving surface (the optical axis direction of the photographic lens barrel 3) is referred to as the optical axis direction of the photoelectric conversion element package 101. The protrusions 108a to 108c are formed at positions corresponding to the exposed area on the rear surface of the photoelectric conversion element package 101.

The size of the opening 109 is smaller than a size of the external shape of the photoelectric conversion element package 101 and larger than the external size of the mounting region of the electronic component 107 on the rear surface of the printed wiring board 102. The electronic component 107, thus, can be provided in the opening 109 without interference from the position adjustment plate 103, and the protrusions 108a to 108c can abut on the exposed area in the rear surface of the photoelectric conversion element package 101. Further, a bonding margin can be secured between the exposed area of the photoelectric conversion element package 101 in the rear surface and the position adjustment plate 103, and bonds can be easily washed down into the bonding margin.

Although the metal position adjustment plate 103 is used in the present exemplary embodiment, a resin position adjustment plate can alternatively be used.

Fixing (bonding) of the photoelectric conversion element package 101 to the position adjustment plate 103 is carried out as follows. First, positioning of the photoelectric conversion element package 101 to the position adjustment plate 103 is carried out in an orthogonal direction to the optical axis direction of the photoelectric conversion element package 101 with jigs that are not illustrated herein.

Next, the protrusions 108a to 108c are struck to the exposed area in the rear surface of the photoelectric conversion element package 101 to position the photoelectric conversion element package 101 in the optical axis direction. Then, from the outer circumference of the photoelectric conversion element package 101, the bond is washed down between the exposed area of the photoelectric conversion element package 101 and the position adjustment plate 103 through the opening 109 formed on the photoelectric conversion element package 101. Thereafter, the bond is cured and the photoelectric conversion element package 101 is fixed on the position adjustment plate 103 in the region outside of the printed wiring board 102 in the rear surface of the package.

Figure 7:
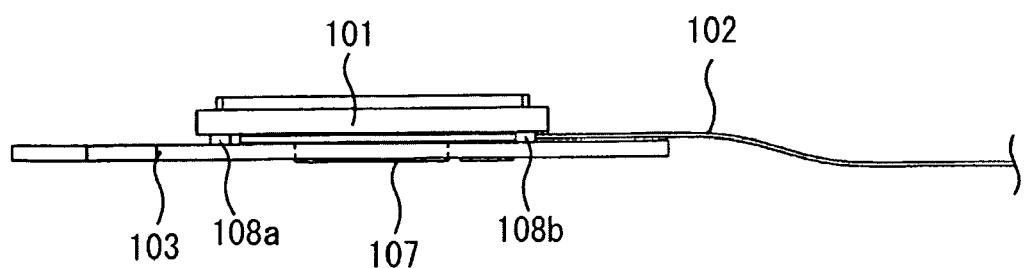
FIG. 7 is a side view of the photoelectric conversion element unit according to the exemplary embodiment of the present invention.

The position relationship of the photoelectric conversion element package 101, the printed wiring board 102, and the position adjustment plate 103, when observed in the thickness direction, is as FIG. 7 illustrates. The position relationship observed from the rear surface is as FIG. 8 illustrates.

In FIG. 7, heights of the protrusions 108a to 108c in the position adjustment plate 103 are set to be higher than the height from the rear surface of the photoelectric conversion element package 101 to the rear surface of the printed wiring board 102 after the photoelectric conversion element package 101 is mounted on the printed wiring board 102. The photoelectric conversion element package 101 is, thus, directly positioned in the optical axis direction by the position adjustment plate 103 in a state where the package 101 is mounted on the printed wiring board 102.

Figure 8:
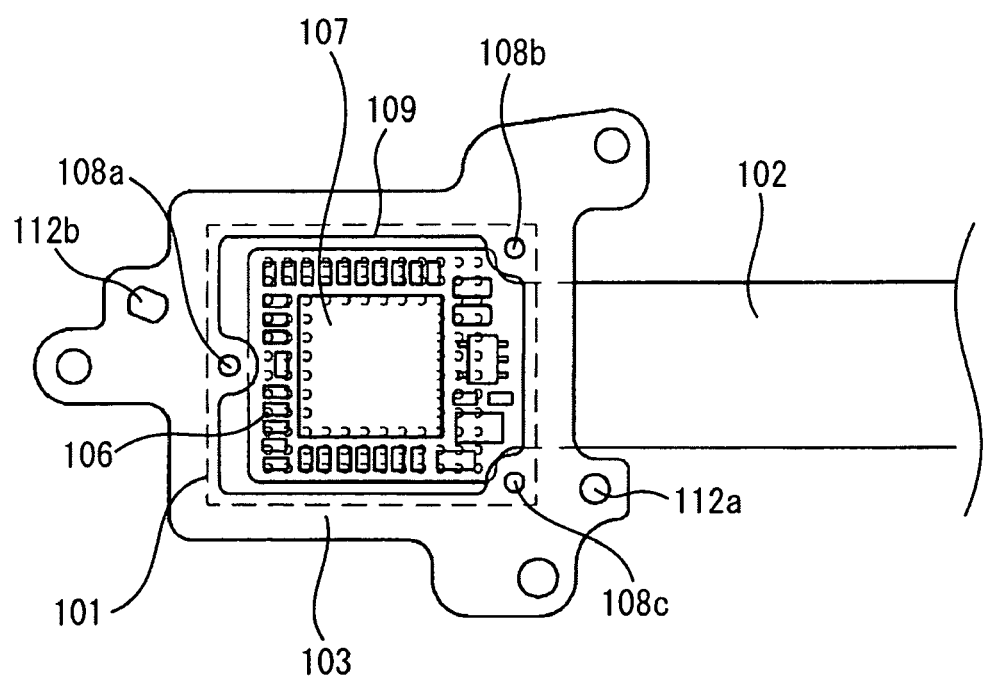
FIG. 8 is a rear surface view of the photoelectric conversion element unit according to the present invention.

In FIG. 8, the opening 109 of the position adjustment plate 103 is formed in a region at the rear surface of the photoelectric conversion element package 101.

The protrusions 108a to 108c are formed at positions contacting the exposed area of the rear surface of the photoelectric conversion element package 101. Accordingly, wider spaces can be taken between the positions contacting the protrusions 108a to 108c in the rear surface of the photoelectric conversion element package 101. Therefore, even if the heights of the protrusions 108a to 108c have variations in a fabricating process, deviation of parallelism of the photoelectric conversion element 105 against the position adjustment plate 103 can be minimized.

Furthermore, the height of the protrusions 108a to 108c can be set to values extremely close to the distance from the rear surface of the photoelectric conversion element package 101 to the rear surface of the printed wiring board 102. Accordingly, a total thickness from the photoelectric conversion element package 101 to the position adjustment plate 103 can be shortened.

In addition, it is useful that a height of the electronic component 107 which is provided within the opening 109 formed in the position adjustment plate 103 be equal to or less than the thickness of the position adjustment plate 103. Thereby, the electric component 107 is prevented from projecting to the rear surface side of the position adjustment plate 103, and increase of the entire thickness of the photoelectric conversion element package 101 due to the providing the electronic component 107 within the opening 109, can also be prevented. In other words, an increase can be prevented of the thickness of the entire image unit including the package 101 after the photoelectric conversion element package 101 is attached.

Figure 11:
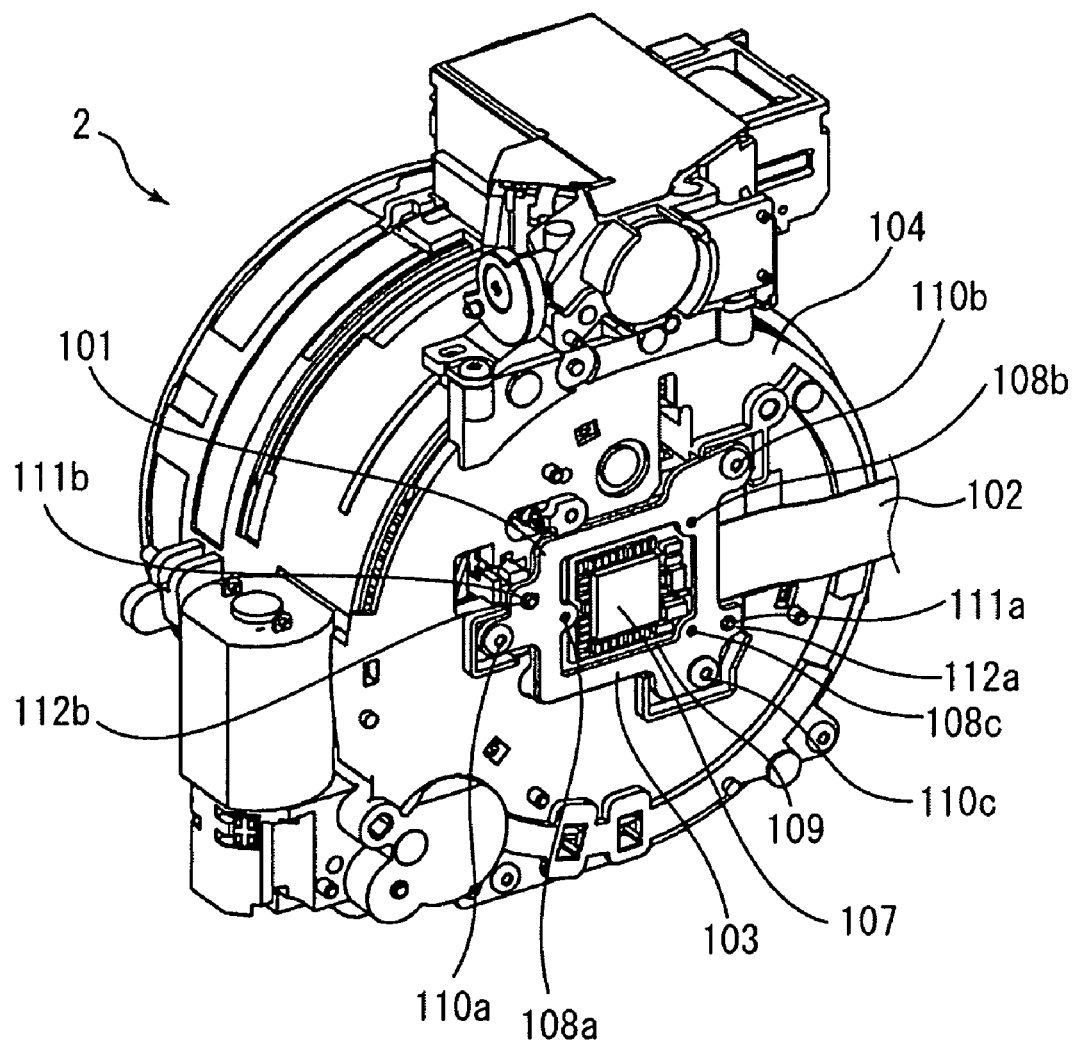
FIG. 11 is a perspective view illustrating the photoelectric conversion element unit attached to the image unit according to the exemplary embodiment of the present invention.

When a photoelectric conversion element unit is completed with the photoelectric conversion element package 101 (and the flexible wiring board 102) fixed to the position adjustment plate 103, the photoelectric conversion element unit is attached to the back side 104 of the image unit 2 with screws 110a, 110b, and 110c used as illustrated in FIG. 11.

Positioning protrusions 111a and 111b are provided on the back side 104 of the image unit 2 as FIG. 3 illustrates. Moreover, positioning holes 112a and 112b are formed on the position adjustment plate 103. The positioning protrusions 111a and 111b are inserted into the positioning holes 112a and 112b so that a position of the photoelectric conversion element unit against the back side 104 of the image unit 2 is determined in the optical axis orthogonal direction.

Recessed portions are formed at three points on the back side 104 of the image unit 2, and springs 113a, 113b, and one more spring(not illustrated herein) are respectively arranged within the recessed portions. The springs 113a and 113b bias the position adjustment plate 103 to the heads of the screws 110a to 110c in the optical axis direction. Accordingly, by finely adjusting a fastening amount of the screws 110a to 110c, the position of the photoelectric conversion element unit can be finely adjusted against the back side 104 on the image unit 2 in the optical axis direction. Further, an inclination of the photoelectric conversion element unit against the optical orthogonal direction can be finely adjusted. Thus, the light receiving surface of the photoelectric conversion element 105 can be aligned against the image forming surface of the image forming lens optical system with high accuracy.

According to the present exemplary embodiment, the photoelectric conversion element package 101, and the electronic component 107 constituting a driving circuit and a signal processing circuit of the photoelectric conversion element 105, can be closely arranged while the photoelectric conversion element package 101 can be positioned by the position adjustment plate 103 with high accuracy. As a result, the wiring length between the photoelectric conversion element 105 and the electronic component 107 can be shortened, and good electric characteristics in the image forming can be obtained.

According to the present exemplary embodiment, the electronic component 107 is mounted on the same printed wiring board 102 as the photoelectric conversion element package 101. In other words, the electronic component 107 is provided in the photoelectric conversion element unit. In a case where the electronic component 107 is mounted on another substrate instead of the printed wiring board 102 (the component is provided outside the photoelectric conversion element unit), a substrate layout is restricted in order to minimize the wiring length from the photoelectric conversion element package 101 to the electronic component 107. However, according to the present exemplary embodiment, the camera can be more freely designed because no such restriction exists. Thus, substrates and various components can be appropriately laid out to miniaturize and slim down the entire camera.

Although a BGA type photoelectric conversion element package is used as the photoelectric conversion element package 101 according to the above exemplary embodiment, a photoelectric conversion element package of a land grid array (LGA) type can be used as well. Further, a photoelectric conversion element package with an electrode arranged at the side (for example, a package of a type in which electrodes are provided at two facing edges) can be used instead of a type with an electrode arranged at the rear surface.

Furthermore, according to the above exemplary embodiment, a near rectangular shape opening 109 is formed at the center of the position adjustment plate 103. The shape of the opening 109 is, however, not limited to the rectangle, but other shapes may be used, such as a circle or a hexagon. A partial cutout may be added to such basic shapes in order to avoid interference with the electronic component 107. Furthermore, an opening can be formed in which a part of an exterior edge is cut out (for example, an opening in a U-shape) instead of the opening with the closed exterior edge according to the present exemplary embodiment.

According to the above exemplary embodiment, the protrusions 108a to 108c are formed on the metal position adjustment plate 103 by a half-blanking processing. However, protrusions may also be formed by spinning or bending work. In this case, the heat of the photoelectric conversion element package can be more effectively radiated by the position adjustment plate 103 by securing a larger contacting area where the protrusions make contact with the rear surface of the photoelectric conversion element package 101.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-318228 filed Dec. 10, 2007, which is hereby incorporated by reference herein in its entirety.

What is claimed is:

1. A photoelectric conversion element unit for use in an imaging apparatus, the photoelectric conversion element unit comprising:
   a photoelectric conversion element package containing a photoelectric conversion element;
   a wiring substrate where the photoelectric conversion element package is mounted on a first surface, and an electronic component related to the photoelectric conversion element is mounted within a mounting region on a rear side of the first surface; and
   a support board attached to an attachment point in the imaging apparatus for fixing the photoelectric conversion element package to the imaging apparatus,
   wherein an opening is formed in the support board, the opening formed in the support board is smaller than an external form of the photoelectric conversion element package and larger than the size of the mounting region where the electronic component is mounted on the wiring substrate,
   wherein the support board is provided on the photoelectric conversion element package such that the electronic component mounted on the wiring substrate is disposed within the opening of the support board and a region extending outside of the wiring substrate in a rear surface of the photoelectric conversion element package is provided within the opening of the support board, and
   wherein a bond is washed down into the region extending outside of the wiring substrate so as to fix the photoelectric conversion element package to the support board.

2. The photoelectric conversion element unit according to claim 1, wherein a plurality of protrusions are formed on the support board and the plurality of protrusions contact the photoelectric conversion element package in the region extending outside of the wiring substrate.

3. The photoelectric conversion element unit according to claim 2, wherein a height of the plurality of protrusions is set larger than a height from the rear surface of the photoelectric conversion element package to the rear side of the first surface of the wiring substrate.

4. The photoelectric conversion element unit according to claim 1, wherein a height of the electronic component mounted on the wiring substrate is set equal to or lower than thickness of the support board.

5. An imaging apparatus comprising:
   a photoelectric conversion element package containing a photoelectric conversion element;
   a wiring substrate where the photoelectric conversion element package is mounted on a first surface, and an electronic component related to the photoelectric conversion element is mounted within a mounting region on a rear side of the first surface; and
   a support board attached to an attachment point in the imaging apparatus for fixing the photoelectric conversion element package to the imaging apparatus,
   wherein an opening is formed in the support board, the opening formed in the support board is smaller than an external form of the photoelectric conversion element package and larger than the size of the mounting region where the electronic component is mounted on the wiring substrate,
   wherein the support board is provided on the photoelectric conversion element package such that the electronic component mounted on the wiring substrate is disposed within the opening of the support board and a region extending outside of the wiring substrate in a rear surface of the photoelectric conversion element package is provided within the opening of the support board, and
   wherein a bond is washed down into the region extending outside of the wiring substrate so as to fix the photoelectric conversion element package to the support board.

6. The imaging apparatus according to claim 5, wherein a plurality of protrusions are formed on the support board and the plurality of protrusions contact the photoelectric conversion element package in the region extending outside of the wiring substrate.

7. The imaging apparatus according to claim 6, wherein a height of the plurality of protrusions is set larger than a height from the rear surface of the photoelectric conversion element package to the rear side of the first surface of the wiring substrate.

8. The imaging apparatus according to claim 5, wherein a height of the electronic component mounted on the wiring substrate is set equal to or lower than thickness of the support board.

* * * * *